United States Patent
Yagi et al.

(10) Patent No.: US 9,546,436 B2
(45) Date of Patent: Jan. 17, 2017

(54) POLYCRYSTALLINE SILICON AND METHOD OF CASTING THE SAME

(71) Applicant: SUMCO CORPORATION, Tokyo (JP)

(72) Inventors: Daichi Yagi, Tokyo (JP); Takahiro Abe, Tokyo (JP)

(73) Assignee: SUMCO CORPORATION, Tokyo (JP)

(*) Notice: Subject to any disclaimer, the term of this patent is extended or adjusted under 35 U.S.C. 154(b) by 293 days.

(21) Appl. No.: 14/387,728

(22) PCT Filed: Mar. 1, 2013

(86) PCT No.: PCT/JP2013/001261
§ 371 (c)(1),
(2) Date: Sep. 24, 2014

(87) PCT Pub. No.: WO2013/145558
PCT Pub. Date: Oct. 3, 2013

(65) Prior Publication Data
US 2015/0082833 A1    Mar. 26, 2015

(30) Foreign Application Priority Data

Mar. 26, 2012   (JP) .................................. 2012-069469

(51) Int. Cl.
*C30B 13/14*        (2006.01)
*C30B 28/10*        (2006.01)
(Continued)

(52) U.S. Cl.
CPC .............. *C30B 28/10* (2013.01); *C30B 11/001* (2013.01); *C30B 11/065* (2013.01); *C30B 29/06* (2013.01);
(Continued)

(58) Field of Classification Search
CPC .......... C30B 29/06; C30B 30/00; C30B 31/02; C30B 13/14
See application file for complete search history.

(56) References Cited

U.S. PATENT DOCUMENTS

| | | | | | |
|---|---|---|---|---|---|
| 4,915,723 | A | * | 4/1990 | Kaneko | ................... B22D 11/11 65/144 |
| 5,211,802 | A | * | 5/1993 | Kaneko | ................... C30B 13/00 117/51 |

(Continued)

FOREIGN PATENT DOCUMENTS

| | | |
|---|---|---|
| CN | 101370969 A | 2/2009 |
| CN | 101796226 A | 8/2010 |

(Continued)

OTHER PUBLICATIONS

Chinese Office Action issued with respect to application No. 201380017179.5, mail date is Mar. 25, 2016.
(Continued)

*Primary Examiner* — Robert M Kunemund
(74) *Attorney, Agent, or Firm* — Greenblum and Bernstein, P.L.C.

(57) ABSTRACT

Casting polycrystalline silicon includes placing a bottomless cooling crucible divided at least partially in the axis direction into a plurality of parts in the peripheral direction and having an inner surface coated with a release agent containing nitrogen, in an induction coil of a chamber charged with an inert gas; melting a raw material of polycrystalline silicon in the bottomless cooling crucible by electromagnetic induction heating using the induction coil; and pulling out the molten silicon downward while cooling and solidifying it. Pullout of the solidified molten silicon is performed through adjusting the carbon concentration of the molten silicon to $4.0 \times 10^{17}$ atoms/cm$^3$ or more to $6.0 \times 10^{17}$ atoms/cm$^3$ or less, the oxygen concentration thereof to $0.3 \times 10^{17}$ atoms/cm$^3$ or (Continued)

more to $5.0\times10^{17}$ atoms/cm$^3$ or less, and the nitrogen concentration to $8.0\times10^{13}$ atoms/cm$^3$ or more to $1.0\times10^{18}$ atoms/cm$^3$ or less.

8 Claims, 3 Drawing Sheets

(51) Int. Cl.
    *C30B 11/00* (2006.01)
    *C30B 29/06* (2006.01)
    *H01L 31/18* (2006.01)
    *C30B 30/04* (2006.01)
    *C30B 11/06* (2006.01)

(52) U.S. Cl.
    CPC ............. *C30B 30/04* (2013.01); *H01L 31/182* (2013.01); *Y02E 10/546* (2013.01); *Y02P 70/521* (2015.11)

(56) References Cited

U.S. PATENT DOCUMENTS

| | | | | |
|---|---|---|---|---|
| 2003/0150374 A1* | 8/2003 | Sasatani | ................ | C30B 29/06 117/50 |
| 2003/0205358 A1* | 11/2003 | Kimura | ................ | B22D 11/115 164/493 |
| 2007/0169684 A1 | 7/2007 | Stoddard | | |
| 2008/0210156 A1 | 9/2008 | Sasatani et al. | | |
| 2009/0044926 A1* | 2/2009 | Kida | ................ | C30B 11/001 164/507 |
| 2013/0247618 A1* | 9/2013 | Yoshihara | ................ | F27B 14/10 65/90 |

FOREIGN PATENT DOCUMENTS

| | | |
|---|---|---|
| CN | 102312290 A | 1/2012 |
| JP | 2-51493 A | 2/1990 |
| JP | 2007-51026 A | 3/2007 |
| JP | 2009-523694 A | 6/2009 |
| JP | 2010-87327 A | 4/2010 |
| JP | 2012036056 A | 2/2012 |
| WO | 2006/104107 A1 | 10/2006 |

OTHER PUBLICATIONS

International search report issued with respect to application No. PCT/JP2013/001261, mail date is Apr. 2, 2013.

Taiwanese Office Action issued with respect to application No. 10320668100, mail date is May 29, 2014.

\* cited by examiner

POLYCRYSTALLINE SILICON AND METHOD OF CASTING THE SAME

TECHNICAL FIELD

The present invention relates to polycrystalline silicon and a method of casting the same, and in particular relates to polycrystalline silicon and a method of casting the same, suitable for increasing the conversion efficiency of solar cells.

BACKGROUND ART

Currently, as substrates for solar cells, silicon crystal is chiefly used. Such silicon crystal is divided into single crystals and polycrystals, and solar cells using single crystal silicon as a substrate have higher conversion efficiency for converting energy of incident light into electrical energy than ones using polycrystalline silicon as a substrate.

Single crystal silicon is produced as a dislocation-free high quality crystal for example by Czochralski process. However, when single crystal silicon is produced by Czochralski process, the production cost is high and such single crystal silicon is not practical being used as a substrate for solar cells. It is therefore common to produce solar cells using polycrystalline silicon which can be cast from inexpensive materials.

One of the methods of casting such polycrystalline silicon is electromagnetic casting (for example, see JP 2007-051026 A (PTL 1)). Electromagnetic casting is a method in which a silicon raw material in a crucible is heated and melted by high frequency induction, meanwhile molten silicon is suspended by the action of strong electromagnetic force, thereby continuously growing an ingot. On this occasion, the molten silicon is not contact with the crucible, so that a high quality ingot can be cast. A polycrystalline silicon wafer obtained from a thus cast polycrystalline silicon ingot is characterized by enabling the production of solar cells that have high uniformity in quality in the casting direction, less variation in the conversion efficiency, and stable characteristics.

In order to increase the conversion efficiency of solar cells, it is important to appropriately control impurities such as oxygen, carbon, and nitrogen that are contained in a polycrystalline silicon wafer. Among others, carbon promotes the precipitation of oxygen and the precipitated oxygen serves as dislocation multiplication sources. The formed dislocations serve as recombination centers of carriers, which results in reduced conversion efficiency of solar cells; thus, it has been considered that the lower the carbon content is in the wafer, the better. For example, WO 2006/104107 (PTL 2) describes a technique of controlling the carbon concentration to $1 \times 10^{17}$ atoms/cm$^3$ or less (the interstitial oxygen concentration is $2 \times 10^{17}$ atoms/cm$^3$ or more), thereby realizing high conversion efficiency of solar cells.

CITATION LIST

Patent Literature

PTL 1: JP 2007-051026 A
PTL 2: WO 2006/104107

SUMMARY OF INVENTION

Technical Problem

However, when polycrystalline silicon having an extremely low carbon concentration satisfying the requirement for the carbon concentration prescribed in PTL 2 was actually cast to fabricate solar cells, the conversion efficiency was found to be reduced instead.

An object of the present invention therefore is to provide polycrystalline silicon and a method of casting the same that are suitable for increasing the conversion efficiency of solar cells.

Solution to Problem

The inventors of the present invention made various studies on ways to solve the above problems. After the inventors actually cast polycrystalline silicon having an extremely low carbon concentration to fabricate solar cells and measured the conversion efficiency to find that the conversion efficiency was reduced instead as described above, they cast polycrystalline silicon of different carbon concentrations and examined the conversion efficiency of the solar cells. As a result, they found that instead of excessively reducing the carbon concentration, controlling the concentrations of oxygen and nitrogen in polycrystalline silicon and adjusting them by adding an appropriate amount of carbon to achieve a predetermined concentration range can improve the conversion efficiency. Thus, they have completed the present invention.

Specifically, the present invention primarily includes the following features.

(1) A polycrystalline silicon wafer, wherein the carbon concentration is $4.0 \times 10^{17}$ atoms/cm$^3$ or more to $6.0 \times 10^{17}$ atoms/cm$^3$ or less, the oxygen concentration is $0.3 \times 10^{17}$ atoms/cm$^3$ or more to $5.0 \times 10^{17}$ atoms/cm$^3$ or less, and the nitrogen concentration is $8.0 \times 10^{13}$ atoms/cm$^3$ or more to $1.0 \times 10^{18}$ atoms/cm$^3$ or less.

(2) A method of casting polycrystalline silicon, comprising the steps of:

placing a bottomless cooling crucible divided at least partially in the axis direction into a plurality of parts in the peripheral direction and having an inner surface coated with a release agent containing nitrogen, in an induction coil of a chamber charged with an inert gas;

melting a raw material of polycrystalline silicon introduced into the bottomless cooling crucible by electromagnetic induction heating using the induction coil; and pulling out the molten silicon downward while sequentially cooling and solidifying it, wherein the carbon concentration of the molten silicon is adjusted to $4.0 \times 10^{17}$ atoms/cm$^3$ or more to $6.0 \times 10^{17}$ atoms/cm$^3$ or less, the oxygen concentration thereof to $0.3 \times 10^{17}$ atoms/cm$^3$ or more to $5.0 \times 10^{17}$ atoms/cm$^3$ or less, and the nitrogen concentration to $8.0 \times 10^{13}$ atoms/cm$^3$ or more to $1.0 \times 10^{18}$ atoms/cm$^3$ or less.

(3) The method of casting polycrystalline silicon, according to (2) above, wherein the adjustment of the carbon concentration is performed by supplying into the chamber a carbon monoxide gas having a partial pressure controlled with respect to the inert gas.

(4) The method of casting polycrystalline silicon, according to (2) above, wherein the adjustment of the carbon concentration is performed by adding carbon powder to the raw material of the polycrystalline silicon.

(5) The method of casting polycrystalline silicon, according to (2) above, wherein the adjustment of the oxygen concentration is performed by supplying into the chamber an oxygen gas having a partial pressure controlled with respect to the inert gas.

(6) The method of casting polycrystalline silicon, according to (2) above, wherein the adjustment of the carbon and oxygen concentrations is performed by supplying into the chamber a carbon dioxide gas having a partial pressure controlled with respect to the inert gas.

(7) The method of casting polycrystalline silicon, according to (2) above, wherein the adjustment of the nitrogen concentration is performed by controlling the area of a top surface of the support base, coated with the release agent containing nitrogen.

(8) The method of casting polycrystalline silicon, according to (2) above, wherein the adjustment of the nitrogen concentration is performed by supplying into the chamber a nitrogen gas having a partial pressure controlled with respect to the inert gas.

(9) The method of casting polycrystalline silicon, according to (2) above, wherein the release agent containing nitrogen comprises silicon nitride, ethyl silicate, purified water, and hydrochloric acid.

Advantageous Effect of Invention

According to the present invention, the crystallinity can be improved by controlling the concentrations of carbon, oxygen, and nitrogen to predetermined concentration ranges, and polycrystalline silicon suitable for increasing the conversion efficiency of solar cells can be cast.

DESCRIPTION OF EMBODIMENTS

Figure 1:
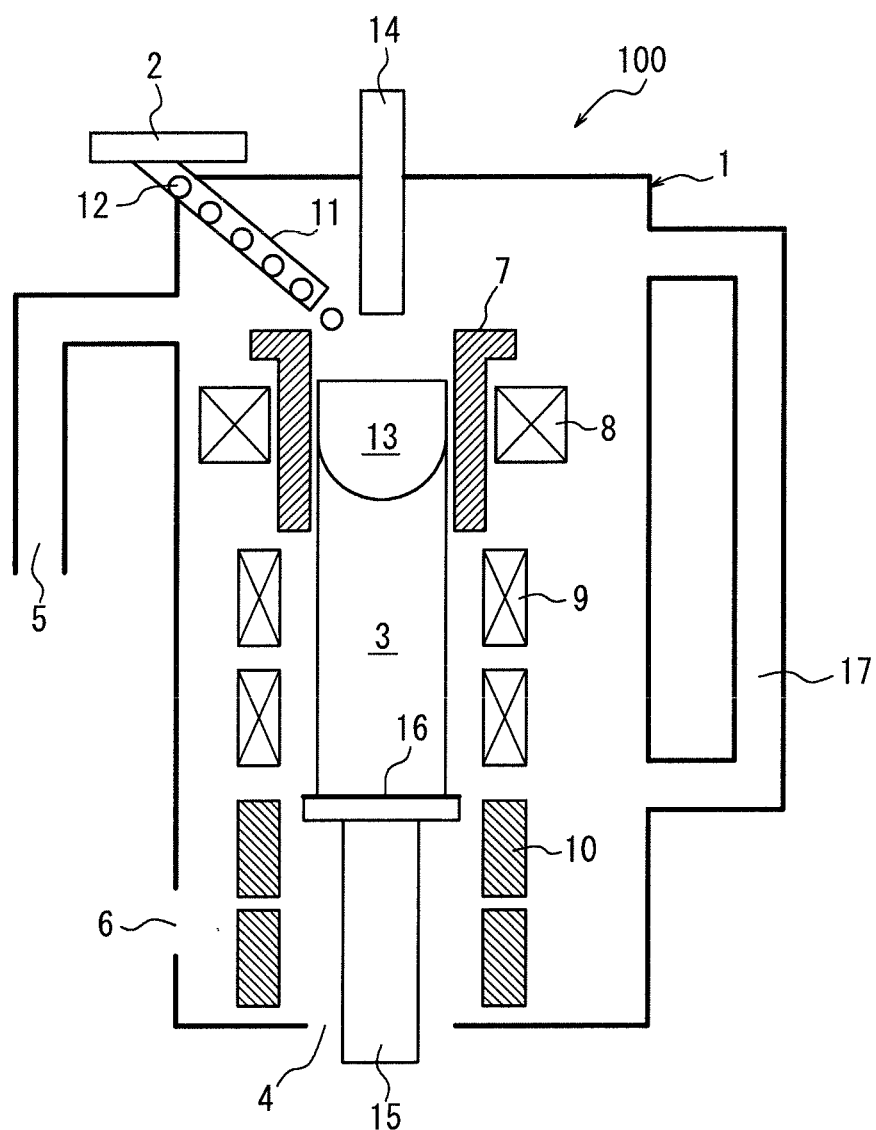
FIG. 1 is a schematic view showing an example of an electromagnetic casting apparatus used for a method of casting polycrystalline silicon according to the present invention.

Embodiments of the present invention will be described below with reference to the drawings.

It is important that the carbon concentration of polycrystalline silicon of the present invention is adjusted to $4.0\times10^{17}$ atoms/cm$^3$ or more to $6.0\times10^{17}$ atoms/cm$^3$ or less and the oxygen concentration thereof to $0.3\times10^{17}$ atoms/cm$^3$ or more to $5.0\times10^{17}$ atoms/cm$^3$ or less, and the nitrogen concentration thereof to $8.0\times10^{13}$ atoms/cm$^3$ or more to $1.0\times10^{18}$ atoms/cm$^3$ or less.

As described above, it has conventionally been considered that as the carbon concentration is lower, the precipitation of oxygen precipitate serving as dislocation multiplication sources is suppressed, thereby improving the conversion efficiency of solar cells. However, the inventors cast polycrystalline silicon having an extremely low carbon concentration adjusted to within the carbon concentration range prescribed in PTL 2 to fabricate solar cells, to find that the conversion efficiency was reduced instead. In view of the above, departing from the conventional concepts, the inventors cast polycrystalline silicon of different carbon concentrations to fabricate polycrystalline silicon wafers; fabricated solar cells using the wafers; and measured the conversion efficiency of the solar cells. As a result, it was revealed that the conversion efficiency was improved more by adding an appropriate amount of carbon to control the concentration to within a predetermined concentration range than by excessively reducing the concentration of carbon in polycrystalline silicon.

Although the cause of this is not perfectly clear, it is assumed as follows. That is, as described above, carbon promotes the precipitation of oxygen and the oxygen precipitate formed becomes a dislocation multiplication source. The dislocations formed become recombination centers to deteriorate the conversion efficiency of solar cells. On the other hand, as described in K. Sumino "Impurity Reaction with Dislocations in Semiconductors", Phys. Stat. Sol. (a)171, 111 (1999), the an oxygen precipitate in silicon has the effect of suppressing the propagation of dislocations. Thus, the crystallinity of polycrystalline silicon is improved and the conversion efficiency is increased. Specifically, it is conceivable that although the addition of an appropriate amount of carbon and nitrogen promoted the precipitation of oxygen to increase the formation of the locations, the propagation of the dislocations formed was suppressed by the oxygen precipitate, resulting in improved crystallinity than the case of suppressing the formation of oxygen precipitate by excessively reducing the concentration of carbon and nitrogen contained in a polycrystalline silicon wafer, which consequently improved the conversion efficiency. The requirements for the concentrations of carbon, oxygen, and nitrogen to be satisfied with respect to polycrystalline silicon of the present invention now will be described.

First, the carbon concentration of polycrystalline silicon is set to $4.0\times10^{17}$ atoms/cm$^3$ or more to $6.0\times10^{17}$ atoms/cm$^3$ or less. Here, the concentration is set to $4.0\times10^{17}$ atoms/cm$^3$ or more, since a carbon concentration of less than $4.0\times10^{17}$ atoms/cm$^3$ is too low to propagate dislocations and accordingly prevents the crystallinity from being improved. Further, the concentration is set to $6.0\times10^{17}$ atoms/cm$^3$ or less because the addition of carbon at more than $6.0\times10^{17}$ atoms/cm$^3$ causes the precipitation of foreign matter including SiC in a polycrystalline silicon ingot to increase crystal defects, which leads to a reduced conversion efficiency.

Further, the oxygen concentration is set to $0.3\times10^{17}$ atoms/cm$^3$ or more to $5.0\times10^{17}$ atoms/cm$^3$ or less. Here, the concentration is set to $0.3\times10^{17}$ atoms/cm$^3$ or more, since a concentration of less than $0.3\times10^{17}$ atoms/cm$^3$ is too low to cause oxygen precipitation. Further, the concentration is set to $5.0\times10^{17}$ atoms/cm$^3$ or less because a concentration exceeding $5.0\times10^{17}$ atoms/cm$^3$ results in the formation of a complex of oxygen and boron.

Further, the concentration of nitrogen in the polycrystalline silicon is set to $8.0\times10^{13}$ atoms/cm$^3$ or more to $1.0\times10^{18}$ atoms/cm$^3$ or less. Here, the concentration is set to $8.0\times10^{13}$ atoms/cm$^3$ or more, since a nitrogen concentration of less than $8.0\times10^{13}$ atoms/cm$^3$ is too low to propagate dislocations and accordingly prevents the crystallinity from being improved. Further, the concentration is set to $1.0\times10^{18}$ atoms/cm$^3$ or less because a concentration exceeding $1.0\times10^{18}$ atoms/cm$^3$ results in the precipitation of foreign matter of silicon nitride ($Si_3N_4$) to reduce the conversion efficiency.

As such, adjustments are made to achieve the predetermined concentration ranges by adding an appropriate amount of carbon, oxygen, and nitrogen, thereby obtaining polycrystalline silicon having improved crystallinity, which is suitable for solar cells having a high conversion efficiency of 16% or more.

Next, a method of casting polycrystalline silicon according to the present invention will be described. FIG. 1 is a schematic view showing an example of a continuous casting apparatus used for a method of casting polycrystalline silicon according to the present invention. This continuous casting apparatus 100 includes a chamber 1, and the chamber 1 is a water cooling vessel having a dual structure, which isolates the inside from the outside air and maintains an inert gas atmosphere suitable for casting.

In the center of the chamber 1, a bottomless cooling crucible 7, an induction coil 8, after heaters 9, and soaking tubes 10 are disposed.

The bottomless cooling crucible 7 is a square cylindrical body made of a metal material such as copper, which is excellent in thermal conductivity and electrical conductivity, serves not only as a melting vessel for melting a silicon raw material 12 introduced but also as a mold, and is suspended in the chamber 1. This bottomless cooling crucible 7 is configured, except its upper part, to be divided in the circumferential direction into a plurality of pieces of short strips such that it is subjected to forced cooling with cooling water flowing inside.

The induction coil 8 is provided concentrically around the bottomless cooling crucible 7 to surround the bottomless cooling crucible 7 and is connected to a power supply device (not shown).

A plurality of after heaters 9 are placed below the bottomless cooling crucible 7 to be concentric to the crucible 7, and include a heater (not shown) or a heat insulator (not shown). The after heaters 9 heat an ingot 3 lowered from the bottomless cooling crucible 7 to give a predetermined temperature gradient in the lowering direction of the ingot 3, thereby preventing crystal defects to be formed in the ingot 3.

In order to prevent cracks from being formed in the ingot 3 due to the residual stress caused by the cooling, the ingot 3 is soaked in the soaking tubes 10 by being maintained at a predetermined temperature for a predetermined time.

A raw material inlet pipe 11 is attached to the upper wall of the chamber 1, and the bottomless cooling crucible 7 is charged with the silicon raw material 12 in particulate or aggregate form through the raw material inlet tube 11 from a raw material supplying unit (not shown) via a shutter 2.

Further, above the bottomless cooling crucible 7, a plasma torch 14 for melting the silicon raw material 12 is liftably provided. One of the poles of a plasma power supply device (not shown) is connected to the plasma torch 14, whereas the other pole is connected to the ingot 3 side. The plasma torch 14 is lowered to be introduced into the bottomless cooling crucible 7.

A side wall of the chamber 1 is provided with a gas inlet 5 for introducing into the chamber 1, an inert gas; or a carbon monoxide gas, an oxygen gas, or a carbon dioxide gas for controlling the oxygen or carbon concentrations of the ingot 3. The gas introduced into the chamber 1 circulates inside the chamber 1 through a circulation pipe 17. The gas introduced into the chamber 1 is exhausted through an exhaust port 6 provided at a lower part of a side wall of the chamber 1.

Further, the bottom wall of the chamber 1 is provided with an outlet 4, configured such that the ingot 3 placed on a support base 16, which has been subjected to a soaking process using the soaking tubes 10 is drawn out from the outlet 4.

Here, a release agent is applied to the top surface of the support base 16 (that is, the surface in contact with the ingot 3) for the purpose of preventing the ingot 3 from being fused to the support base 16. The slurry-formed release agent can be obtained by mixing release agent powder such as silicon nitride, silicon carbide, or silicon oxide into a solution composed of a binder and a solvent. After applying the release agent to the top surface of the support base 16 with a brush or spray, a debinding treatment for removing the solvent and the binder is performed, thereby forming a release agent layer on the support base 16. This debinding treatment is specifically a treatment for removing the binder and the solvent in the release agent by heat treating the support base 16 in the atmosphere, for example, at a temperature of 120° C. for one hour.

In the present invention, the release agent is used not only for preventing the fusion between the ingot 3 and the support base 16 mounted on a support shaft 15 as described above but also for controlling the nitrogen concentration of the ingot 3. Therefore, a release agent containing nitrogen is used. The release agent layer obtained from such a release agent is brought into contact with molten silicon 13 at an initial stage of casting; accordingly, when nitrogen is contained in the release agent layer, nitrogen diffuses into the molten silicon 13 to be added to the ingot 3 (that is, polycrystalline silicon).

Here, as the release agent powder containing nitrogen, silicon nitride can be used. As the binder, polyvinyl alcohol (PVA), ethyl silicate, or the like can be used, whereas as the solvent, purified water or alcohol can be used. Further, when ethyl silicate is used as the binder, hydrochloric acid can be used as an additive in order to promote the hydrolysis. They are mixed to form a slurry to be applied to the top surface of the support base 16, thereby performing the debinding treatment; thus, the release agent layer can be formed on the top surface of the support base 16.

The nitrogen concentration of the ingot 3 can be controlled by adjusting the area to be coated with the above release agent. For example, when 100 g of silicon nitride powder, 100 ml of ethyl silicate as a binder, 400 ml of purified water as a solvent, and 0.5 ml of hydrochloric acid as an additive are mixed to form a slurry and the area of the top surface of the support base 16 to be coated with the resultant release agent is changed by 200 cm$^2$, the nitrogen concentration of the ingot 3 can be changed by $1.6 \times 10^{17}$ atoms/cm$^3$. The nitrogen concentration of the ingot 3 in the case where the release agent is not applied varies between each ingot 3 depending on the purity of the silicon raw material 12 and the like; the nitrogen concentration is adjusted to the range prescribed above by controlling the area to be coated with the release agent in accordance with the nitrogen concentration in the case where the release agent is not applied. For example, when the nitrogen concentration of the ingot 3 in the case where the release agent is not applied is $7.0 \times 10^{13}$ atoms/cm$^3$ and the nitrogen concentration of the release agent is 17 mass %, the nitrogen concentration can be adjusted to $8.0 \times 10^{13}$ atoms/cm$^3$ or more to $1.0 \times 10^{18}$ atoms/cm$^3$ or less with an application area of 1 cm$^2$ or more to 1300 cm$^2$ or less.

The various studies having been conducted by the inventors revealed that although the nitrogen concentration of a release agent is changed, the amount of nitrogen diffusing into the ingot 3 does not change and accordingly the nitrogen concentration changes depending on the application area of the release agent.

Further, the nitrogen concentration of the above-described ingot 3 can be measured, for example, by secondary ion mass spectrometry (SIMS).

Subsequently, the shutter 2 is opened to introduce the silicon raw material 12 of polycrystalline silicon or the like into the crucible 7 from the raw material supplying unit (not shown) through the raw material inlet tube 11.

Next, the lowered plasma torch 14 is energized while applying alternating current to the induction coil 8. Here, the pieces of the short strips forming the bottomless cooling crucible 7 are electrically isolated, which results in the generation of eddy current in each piece with the electromagnetic induction caused by the induction coil 8; thus, the eddy current on the inner wall side of the bottomless cooling crucible 7 generates a magnetic field in the crucible. Consequently, the silicon raw material 12 in the bottomless cooling crucible 7 is melted by electromagnetic induction heating to obtain the molten silicon 13.

Here, the plasma torch 14 is used, so that plasma arc is generated between the plasma torch 14, and the silicon raw material 12 and the molten silicon 13, and the silicon raw material 12 is also heated by the resultant Joule heat to be melted. Therefore, the burden on the electromagnetic induction heating is reduced, so that the molten silicon 13 can be obtained efficiently.

Here, the molten silicon 13 in the bottomless cooling crucible 7 is subjected to the interaction between the magnetic field generated with the eddy current on the inner walls of the crucible 7, and the current generated on the surface of the molten silicon 13 causes a force in a direction from the bottomless cooling crucible 7 to the molten silicon (pinch force); thus, the molten silicon is kept without being in contact with the bottomless cooling crucible 7. Thus, contamination can be prevented by controlling mixing of impurities from the bottomless cooling crucible 7 into the molten silicon 13, and it is made easier to lower the ingot 3 mounted on the support shaft 15.

Normally, when the above silicon raw material 12 is melted, an inert gas such as argon is introduced from the gas inlet 5 into the chamber 1; however, in the present invention, in order to control the oxygen and carbon concentrations of the ingot 3, a carbon monoxide gas and an oxygen gas are introduced with the inert gas. As described above, in order to obtain single crystal silicon suitable for solar cells having high conversion efficiency, in addition to the control of the nitrogen concentration using the above described release agent, it is required to control the oxygen concentration to $0.3 \times 10^{17}$ atoms/cm$^3$ or more to $5.0 \times 10^{17}$ atoms/cm$^3$ or less as well as to add carbon at an appropriate amount to control the carbon concentration to $4.0 \times 10^{17}$ atoms/cm$^3$ or more to $6.0 \times 10^{17}$ atoms/cm$^3$ or less.

The inventors made various studies on the oxygen and carbon concentrations of the ingot 3 to find that the partial pressures of the oxygen gas and the carbon monoxide gas with respect to the inert gas have effects on the oxygen concentration and the carbon concentration of the ingot 3, respectively. Further, it was found that in order to increase the carbon concentration of the ingot 3 by $1.0 \times 10^{17}$ atoms/cm$^3$, for example, when argon gas is used as an inert gas at a flow rate of 200 l/min and an internal reactor pressure of 0.03 kg/cm$^2$, a carbon monoxide gas having a partial pressure $1.2 \times 10^{-4}$ times that of the argon gas may be supplied. It was found that also when controlling the oxygen concentration, in order to control the oxygen concentration by $1.0 \times 10^{17}$ atoms/cm$^3$, an oxygen gas having a partial pressure $4.6 \times 10^{-5}$ times that of the argon gas may be supplied.

Note that as with the nitrogen concentration, the carbon concentration and the oxygen concentration of the ingot 3 where a carbon monoxide gas and an oxygen gas are not mixed into the inert gas, vary depending on each ingot 3. Accordingly, in accordance with the carbon concentration and the oxygen concentration of the ingot 3 where a carbon monoxide gas and an oxygen gas are not mixed into the inert gas, the partial pressures of the carbon monoxide gas and the oxygen gas with respect to the inert gas are controlled to be adjusted to the ranges of the carbon concentration and the oxygen concentration described above.

For example, when the carbon concentration of the ingot 3 in the case where a carbon monoxide gas and an oxygen gas are not mixed into the inert gas is $2.0 \times 10^{17}$ atoms/cm$^3$, whereas the relevant oxygen concentration is $0.1 \times 10^{17}$ atoms/cm$^3$, the oxygen concentration of the ingot 3 can be adjusted to $0.3 \times 10^{17}$ atoms/cm$^3$ or more to $5.0 \times 10^{17}$ atoms/cm$^3$ or less, and the carbon concentration can be adjusted to $4.0 \times 10^{17}$ atoms/cm$^3$ or more to $6.0 \times 10^{17}$ atoms/cm$^3$ or less by controlling the partial pressure of the carbon monoxide gas to $2.5 \times 10^{-4}$ times or more to $5.0 \times 10^{-4}$ times or less with respect to the inert gas and controlling the partial pressure of the oxygen gas to $1.2 \times 10^{-5}$ times or more to $1.9 \times 10^{-4}$ times or less.

Note that the carbon concentration and the oxygen concentration of the ingot 3 can be measured, for example, by Fourier transform infrared spectroscopy (TF-IR), and the oxygen concentration is a concentration defined based on ASTM F121-1979, whereas the carbon concentration is a concentration defined based on ASTM F123-1981 (ASTM: American Society for Testing and Materials)).

Instead of mixing of the carbon monoxide gas as described above, carbon powder can be added to the silicon raw material 12 to control the carbon concentration. For example, when the carbon concentration of the ingot 3 in the case where carbon powder is not added to the ingot 3 is $2.0 \times 10^{17}$ atoms/cm$^3$, carbon powder of $1.7 \times 10^{-3}$ times or more to $3.4 \times 10^{-3}$ times or less with respect to the total weight of the raw material subtracting the carbon powder weight is added, thereby satisfying the requirements relating to the above carbon concentration. Here, graphite powder is preferably used as the carbon powder, since it easily melts in molten silicon.

Further, instead of controlling the carbon and oxygen concentrations by the mixing of an oxygen gas and a carbon monoxide gas as described above, the oxygen and carbon concentrations can be simultaneously controlled by mixing carbon dioxide. Also in this case, the partial pressure of the carbon dioxide gas with respect to the inert gas has effects on the oxygen concentration and the carbon concentration of the ingot 3. For example, when the carbon concentration of the ingot 3 when a carbon dioxide is not mixed into the inert gas is $2.0 \times 10^{17}$ atoms/cm$^3$ and the oxygen concentration is $0.1 \times 10^{17}$ atoms/cm$^3$, the partial pressure of the carbon dioxide can be adjusted to $2.5 \times 10^{-4}$ times or more to $5.0 \times 10^{-4}$ times or less with respect to the inert gas, thereby adjusting the oxygen concentration to $0.3 \times 10^{17}$ atoms/cm$^3$ or more to $5.0 \times 10^{17}$ atoms/cm$^3$ or less and the carbon concentration to $4.0 \times 10^{17}$ atoms/cm$^3$ or more to $6.0 \times 10^{17}$ atoms/cm$^3$ or less.

As described above, for the molten silicon 13 having the adjusted carbon, oxygen, and nitrogen concentrations, the shaft 15 supporting the molten silicon 13 is gradually lowered to solidify the molten silicon 13. Specifically, the molten silicon 13 inside the crucible 7 is moved away from the bottom end of the induction coil 8 by lowering the support shaft 15, so that the induced magnetic field is reduced and the heating value and the pinch force are reduced; accordingly, the molten silicon 13 is cooled by the bottomless cooling crucible 7 to be solidified from the periphery.

Thus, while the above support shaft 15 is lowered, the silicon raw material 12 is continuously and additionally introduced to the bottomless cooling crucible 7 through the raw material inlet tube 11, thereby successively melting and solidifying the silicon raw material 12, which allows polycrystalline silicon to be continuously cast.

The ingot 3 obtained through the solidification of the molten silicon 13 is cooled over long hours to room temperature using the after heaters 9 and the soaking tubes 10. The ingot 3 is heated using the after heaters 9 to impart an appropriate temperature gradient in the lowering direction, thereby preventing the formation of crystal defects in the ingot 3 while cooling.

Further, in order to prevent the formation of cracks in the ingot 3 due to the residual stress caused by the cooling, the ingot 3 is subjected to soaking by being maintained at a predetermined temperature for a predetermined time using a heater (not shown) of the soaking tubes 10. The maintained temperature of the ingot 3 in soaking is, in general, preferably about 1100° C., since at a temperature exceeding 1200° C., the speed of dislocation growth in crystals is high and crystal defects are easily formed.

After soaking, the output of the heater (not shown) of the soaking tubes 10 is lowered to cool the ingot 3 to room temperature. Thus, the polycrystalline silicon ingot 3 can be cast through adjusting the oxygen concentration to $0.3 \times 10^{17}$ atoms/cm$^3$ or more to $5.0 \times 10^{17}$ atoms/cm$^3$ or less, the carbon concentration to $4.0 \times 10^{17}$ atoms/cm$^3$ or more to $6.0 \times 10^{17}$ atoms/cm$^3$ or less, and the nitrogen concentration to $8.0 \times 10^{13}$ atoms/cm$^3$ or more to $1.0 \times 10^{18}$ atoms/cm$^3$ or less.

Note that in the above method, the nitrogen concentration of the ingot 3 is controlled by controlling the area of the release agent containing nitrogen applied to the top surface of the support base 16; alternatively, a nitrogen gas can be mixed into the inert gas as in the case of controlling the carbon concentration and the oxygen concentration. Also in this case, the partial pressure of the nitrogen gas with respect to the inert gas has an effect on the nitrogen concentration of the ingot 3. For example, when the nitrogen concentration of the ingot 3 in the case where a nitrogen gas is not mixed into the inert gas is $1.0 \times 10^{13}$ atoms/cm$^3$, the partial pressure of the nitrogen gas is controlled to $7.2 \times 10^{-7}$ times or more to $1.0 \times 10^{-2}$ times or less with respect to the inert gas, thereby adjusting the nitrogen concentration to $8.0 \times 10^{13}$ atoms/cm$^3$ or more to $1.0 \times 10^{18}$ atoms/cm$^3$ or less.

Here, in the case where the nitrogen concentration is adjusted by mixing of a nitrogen gas, a release agent free of nitrogen is used.

Further, the conductivity of the polycrystalline silicon can be controlled by introducing a silicon raw material 12 doped with a dopant. Specifically, when casting p-type polycrystalline silicon, boron, gallium, aluminum, or the like can be used as the dopant. On the other hand, when casting n-type polycrystalline silicon, phosphorus, arsenic, antimony, or the like can be used as the dopant.

Thus, with the oxygen and nitrogen concentrations being adjusted to appropriate ranges, the carbon concentration can be adjusted to an appropriate range by incorporating carbon in the crystal at an appropriate content, thereby improving the crystallinity. Accordingly, polycrystalline silicon suitable for solar cells having high conversion efficiency can be cast.

A polycrystalline silicon ingot obtained by the method of casting polycrystalline silicon according to the present invention is divided into polycrystalline blocks and the polycrystalline blocks are then sliced, thereby producing polycrystalline silicon wafers suitable for solar cells having high conversion efficiency.

EXAMPLES

Invention Examples

Examples of the present invention will now be described.

Polycrystalline silicon ingots were cast in accordance with a method of the present invention. Specifically, first, a release agent obtained by mixing 100 g of silicon nitride as release agent powder, 100 ml of ethyl silicate as a binder, 400 ml of purified water as a solvent, and 0.5 ml of hydrochloric acid as an additive was prepared and applied to the top surface of the support base 16. The nitrogen concentration of the ingots 3 was adjusted by controlling the area of the top surface of the support base 16 coated with the release agent to 1 cm$^2$, 50 cm$^2$, and 1300 cm$^2$, such that the nitrogen concentration is adjusted to $8 \times 10^{13}$ atoms/cm$^3$, $1 \times 10^{15}$ atoms/cm$^3$, and $1 \times 10^{18}$ atoms/cm$^3$, respectively. After that, for debinding, the support base 16 was heat treated and maintained at 120° C. for one hour, and then cooled to room temperature, thus forming a release agent layer on the top surface of the support base 16.

Next, as shown in FIG. 1, the shutter 2 was opened; 20 kg of polycrystalline silicon was introduced as the silicon raw material 12 into the bottomless cooling crucible 7 through the raw material inlet tube 11.

Subsequently, the silicon raw material 12 inside the crucible 7 was heated to 1420° C. and melted by an induction coil 8 and a plasma torch 14, thus obtaining molten silicon 13. Further, the support base 16 was lowered while adding the silicon raw material 12 and melting the silicon raw material 12, thus casting each polycrystalline silicon ingot 3 having a length of 7000 mm.

At that time, an oxygen gas and a carbon monoxide gas were supplied with an argon gas from a gas inlet 5 into a chamber 1. The partial pressure of the carbon monoxide gas was $2.5 \times 10^{-4}$ times, $3.7 \times 10^{-4}$ times, and $5.0 \times 10^{-4}$ times with respect to the argon gas, such that the carbon concentration of the ingot 3 was $4.0 \times 10^{17}$ atoms/cm$^3$, $5.0 \times 10^{17}$ atoms/cm$^3$, and $6.0 \times 10^{17}$ atoms/cm$^3$. Note that the carbon concentration of the polycrystal was $2.0 \times 10^{17}$ atoms/cm$^3$ on the assumption that the carbon monoxide gas was not added. Further, the partial pressure of the oxygen gas was $1.2 \times 10^{-5}$ times, $6.2 \times 10^{-5}$ times, $1.9 \times 10^{-4}$ times with respect to the argon gas such that the oxygen concentration was $3.0 \times 10^{16}$ atoms/cm$^3$, $2.0 \times 10^{17}$ atoms/cm$^3$, and $5.0 \times 10^{17}$ atoms/cm$^3$, respectively. Note that the oxygen concentration of the polycrystal was $1.0 \times 10^{16}$ atoms/cm$^3$ on the assumption that the oxygen gas was not added.

Thus obtained ingots each having a size of 345 mm×510 mm were each divided into six, and 1000 wafers having a square shape with a side length of 156 mm and a thickness of 180 μm were cut out from a position at the center in the longitudinal direction (2000 mm from the end of the ingot) of each polycrystalline silicon ingot of Invention Examples. Ten wafers of them were subjected to simulated acid texturing (HF:HNO$_3$:H$_2$=1:4:5, room temperature, five minutes), and a nitride film was then formed on each wafer by vapor phase epitaxy (CVD).

Comparative Examples

Polycrystalline silicon was cast as in the invention examples. However, the partial pressure of the carbon monoxide was $1.9 \times 10^{-4}$ times and $8.7 \times 10^{-4}$ times with respect to the argon gas such that the carbon concentration of the ingots 3 was $3 \times 10^{17}$ atoms/cm$^3$ and $7 \times 10^{17}$ atoms/cm$^3$, respectively. Note that the carbon concentration of the polycrystal was $2.0 \times 10^{17}$ atoms/cm$^3$ on the assumption that the carbon monoxide gas was not added. Further, the partial pressure of oxygen was $2.5 \times 10^{-4}$ times with respect to the argon gas such that the oxygen concentration was $6.0 \times 10^{17}$ atoms/cm$^3$. Note that the oxygen concentration of the polycrystal was $1.0 \times 10^{16}$ atoms/cm$^3$ on the assumption that the oxygen gas was not added. Moreover, the area of the release agent applied to the top surface of the support base 16 was 0 cm$^2$ and 1700 cm$^2$ such that the nitrogen concentration was $7.0 \times 10^{13}$ atoms/cm$^3$ and $2.0 \times 10^{18}$ atoms/cm$^3$. All the other conditions are the same as those in Invention Example 1.

<Conversion Efficiency>

Figure 2:
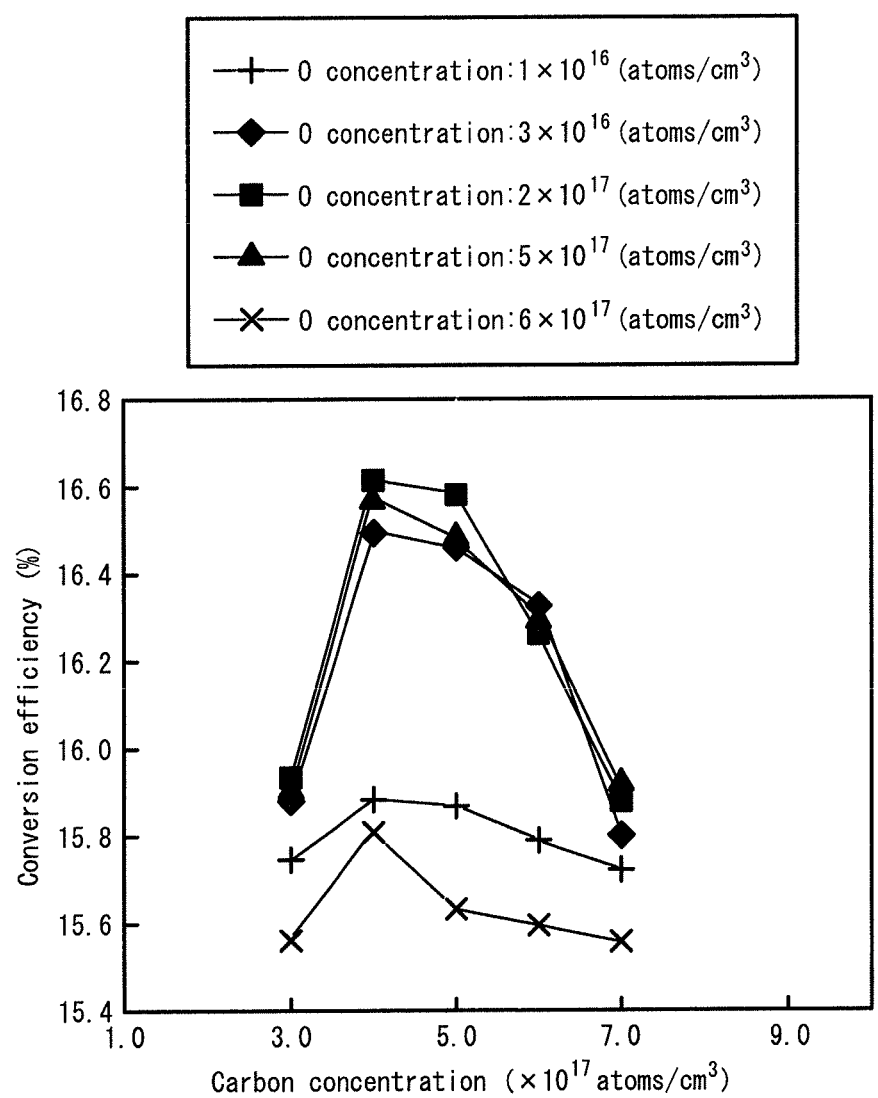
FIG. 2 is a diagram showing the relationship between the carbon and oxygen concentrations and the conversion efficiency of solar cells.
Figure 3:
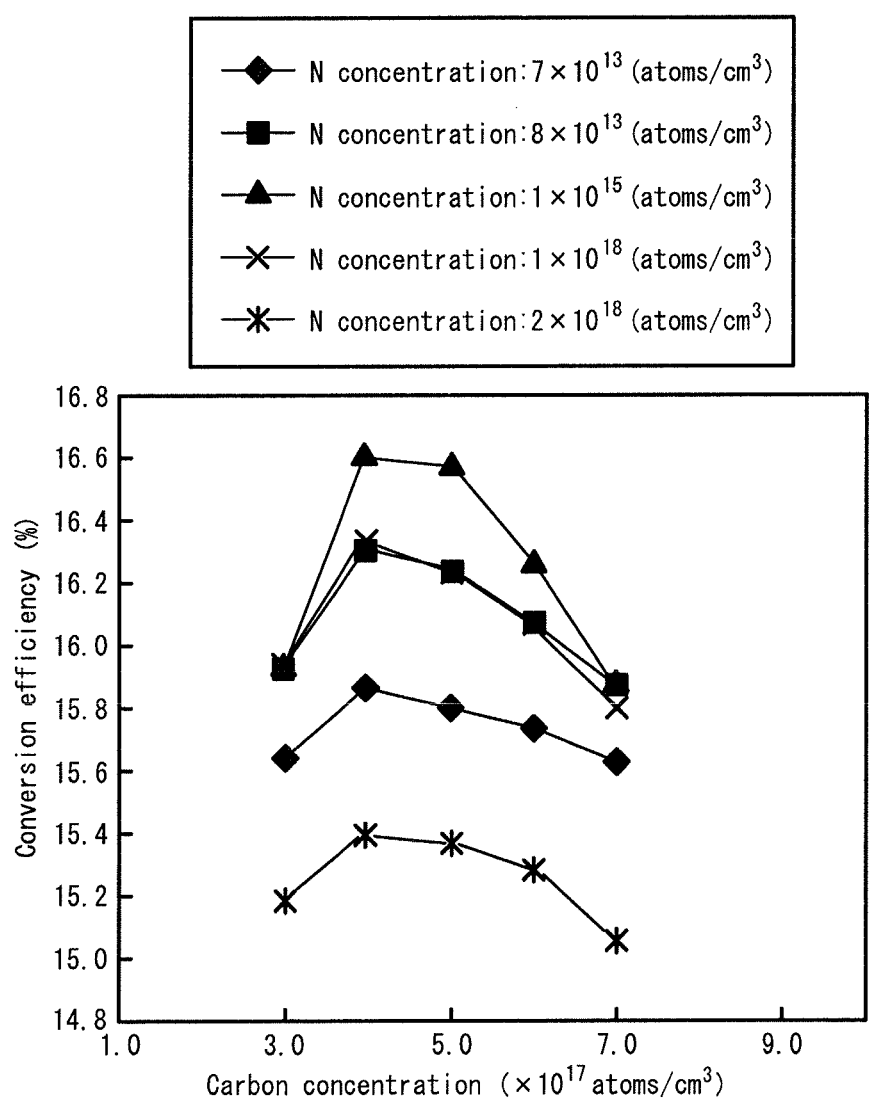
FIG. 3 is a diagram showing the relationship between the carbon and nitrogen concentrations and the conversion efficiency of solar cells.

Ten of the fabricated 1000 wafers were used to fabricate solar cells for evaluation and the conversion efficiency was measured. The relationship between the carbon concentration of the ingots 3 and the conversion efficiency is shown in FIGS. 2 and 3. Here, FIG. 2 shows a result obtained where the nitrogen concentration was fixed to $1 \times 10^{15}$ atoms/cm$^3$ and the oxygen concentration and the carbon concentration were changed, whereas FIG. 3 shows a result obtained where the oxygen concentration was fixed to $2 \times 10^{17}$ atoms/cm$^3$ and the carbon concentration and the oxygen concentration were changed. The conversion efficiency shown on the vertical axis is the average of the 10 wafers. The conversion efficiency is given as a value of the electrical energy E2 after conversion, taken out from the light energy E1 of light on a unit area of the solar cells (E2/E1)×100(%). As is apparent from FIGS. 2 and 3, when the carbon concentration was adjusted to $4.0 \times 10^{17}$ atoms/cm$^3$ or more to $6.0 \times 10^{17}$ atoms/cm$^3$ or less, the oxygen concentration was adjusted to $0.3 \times 10^{17}$ atoms/cm$^3$ or more to $5.0 \times 10^{17}$ atoms/cm$^3$ or less, and the nitrogen concentration was adjusted to $8.0 \times 10^{13}$ atoms/cm$^3$ or more to $1.0 \times 10^{18}$ atoms/cm$^3$ or less; a high conversion efficiency exceeding 16% was obtained.

INDUSTRIAL APPLICABILITY

In the prevent invention, with the oxygen and nitrogen concentrations being adjusted to appropriate ranges, the carbon concentration can be adjusted to an appropriate range by incorporating carbon in the crystal at an appropriate content, thereby improving the crystallinity. Accordingly, thus obtained polycrystalline silicon is suitable for solar cells having high conversion efficiency.

REFERENCE SIGNS LIST

1: Chamber
2: Shutter
3: Ingot
4: Outlet
5: Gas inlet
6: Exhaust port
7: Bottomless cooling crucible
8: Induction coil
9: After heater
10: Soaking tube
11: Raw material inlet tube
12: Silicon raw material
13: Molten silicon
14: Plasma torch
15: Support shaft
16: Support base
17: Circulation pipe

The invention claimed is:

1. A method of casting polycrystalline silicon, comprising the steps of:
    placing a bottomless cooling crucible divided at least partially in the axis direction into a plurality of parts in the peripheral direction and having an inner surface coated with a release agent containing nitrogen, in an induction coil of a chamber charged with an inert gas;
    melting a raw material of polycrystalline silicon introduced into the bottomless cooling crucible by electromagnetic induction heating using the induction coil; and
    pulling out the molten silicon downward while sequentially cooling and solidifying it,
    wherein the carbon concentration of the molten silicon is adjusted to $4.0 \times 10^{17}$ atoms/cm$^3$ or more to $6.0 \times 10^{17}$ atoms/cm$^3$ or less, the oxygen concentration thereof to $0.3 \times 10^{17}$ atoms/cm$^3$ or more to $5.0 \times 10^{17}$ atoms/cm$^3$ or less, and the nitrogen concentration to $8.0 \times 10^{13}$ atoms/cm$^3$ or more to $1.0 \times 10^{18}$ atoms/cm$^3$ or less.

2. The method of casting polycrystalline silicon, according to claim 1, wherein the adjustment of the carbon concentration is performed by supplying into the chamber a carbon monoxide gas having a partial pressure controlled with respect to the inert gas.

3. The method of casting polycrystalline silicon, according to claim 1, wherein the adjustment of the carbon concentration is performed by adding carbon powder to the raw material of the polycrystalline silicon.

4. The method of casting polycrystalline silicon, according to claim 1, wherein the adjustment of the oxygen concentration is performed by supplying into the chamber an oxygen gas having a partial pressure controlled with respect to the inert gas.

5. The method of casting polycrystalline silicon, according to claim 1, wherein the adjustment of the carbon and oxygen concentrations is performed by supplying into the chamber a carbon dioxide gas having a partial pressure controlled with respect to the inert gas.

6. The method of casting polycrystalline silicon, according to claim 1, wherein the adjustment of the nitrogen concentration is performed by controlling the area of a top surface of the support base, coated with the release agent containing nitrogen.

7. The method of casting polycrystalline silicon, according to claim 1, wherein the adjustment of the nitrogen concentration is performed by supplying into the chamber a nitrogen gas having a partial pressure controlled with respect to the inert gas.

8. The method of casting polycrystalline silicon, according to claim 1, wherein the release agent containing nitrogen comprises silicon nitride, ethyl silicate, purified water, and hydrochloric acid.

* * * * *